United States Patent
Kishi et al.

(10) Patent No.: US 7,946,713 B2
(45) Date of Patent: May 24, 2011

(54) DISPLAY APPARATUS

(75) Inventors: Yuji Kishi, Yokohama (JP); Nobuyuki Kaku, Oiso (JP)

(73) Assignee: Hitachi, Ltd., Tokyo (JP)

( * ) Notice: Subject to any disclaimer, the term of this patent is extended or adjusted under 35 U.S.C. 154(b) by 1011 days.

(21) Appl. No.: 11/686,526

(22) Filed: Mar. 15, 2007

(65) Prior Publication Data

US 2007/0230122 A1    Oct. 4, 2007

(30) Foreign Application Priority Data

Mar. 31, 2006    (JP) .................................. 2006-096401

(51) Int. Cl.
*G03B 21/18* (2006.01)

(52) U.S. Cl. ................ 353/57; 353/60; 353/61; 353/74; 353/76; 353/77; 353/78; 353/79; 353/47; 353/52; 353/56; 353/119; 353/122; 348/782; 348/787; 348/748; 348/789; 348/794; 348/836; 348/837; 348/844; 359/460; 359/453; 359/444

(58) Field of Classification Search ............ 353/60, 353/57, 61, 74, 76, 77, 78, 79, 47, 52, 56, 353/119, 122; 348/782, 787, 748, 789, 794, 348/836, 837, 844; 359/460, 453, 444; 361/690, 361/679.21, 679.5, 695, 681, 682, 688, 689, 361/694; 174/16.1, 16.3; 165/80.3, 104.33, 165/122; 349/5, 7, 8, 58

See application file for complete search history.

(56) References Cited

U.S. PATENT DOCUMENTS

| | | | | |
|---|---|---|---|---|
| 4,237,493 A | * | 12/1980 | Appeldorn | 348/782 |
| 5,929,945 A | * | 7/1999 | Negishi et al. | 348/825 |
| 6,533,421 B2 | * | 3/2003 | Ono | 353/61 |
| 6,851,810 B2 | * | 2/2005 | Arai et al. | 353/15 |
| 7,002,798 B2 | * | 2/2006 | Seki et al. | 361/695 |
| 7,384,155 B2 | * | 6/2008 | Seki | 353/60 |
| 2003/0189694 A1 | * | 10/2003 | Yamada et al. | 353/77 |
| 2006/0170879 A1 | * | 8/2006 | Kato et al. | 353/77 |

FOREIGN PATENT DOCUMENTS

| | | |
|---|---|---|
| JP | 09-098360 | 4/1997 |
| JP | 2004-294781 | 10/2004 |

* cited by examiner

*Primary Examiner* — Georgia Y Epps
*Assistant Examiner* — Sultan Chowdhury
(74) *Attorney, Agent, or Firm* — Antonelli, Terry, Stout & Kraus, LLP.

(57) ABSTRACT

A display apparatus, comprises a filter unit 33 attached on an air inlet opening 28a, having such a filter 36 that a suction negative load generating at the air inlet opening 28a formed in an upper cabinet 3 comes to be smaller than the suction load generating at gaps 29a and 30a defined in the upper cabinet 3, when driving a cooling unit 18, for sucking an air from the upper cabinet 3 and discharging the air used for cooling into the upper cabinet 3, when cooling down optical parts, such as, display devices 15R, etc., and a polarizing plate 16R, etc., of an optic unit 9.

9 Claims, 9 Drawing Sheets

DISPLAY APPARATUS

BACKGROUND OF THE INVENTION

The present invention relates to a display apparatus, for enlargedly projecting an image or picture displayed on a display device, onto a screen through a projection lens, and it relates, in particular, to a display apparatus preventing dusts from entering into an inside of the display apparatus.

In the display apparatus, projecting an image or picture displayed on a display device(s) of liquid crystal, etc., on a screen from a rear side thereof by means of a projection lens, optical parts, such as, the display device(s) and polarizing plate (s), which are provided around them, generates heats due to light incident thereupon. It is necessary to cool down those optical parts, from a viewpoint of a long lifetime, etc., and it is general to provide a fan or the like, so as to obtain air-cooling thereof. Also, those optical parts, since the performances thereof are deteriorated when dusts attach thereon, there is necessity of suppressing the dusts from entering into an air duct for a cooling air.

With the display apparatus of the conventional arts, suppressing is made on permeation of the dusts, by sucking an air inside an upper cabinet, which is sealed with a screen and a cabinet, thereby to cool down the display devices of an optical unit and the optical parts provided around there, which are installed within a lower cabinet, due to that air, and discharging the air after cooling into the upper cabinet, again, i.e., like so-called an inner air circulation. The cooling structure of such is already disclosed in Japanese Patent Laying-Open No. 2004-294781 (2004), for example.

SUMMARY OF THE INVENTION

Within the display apparatus of the Japanese Patent Laying-Open No. 2004-294781 (2004), a suction duct, for connecting the upper cabinet and the suction portion of a fan, and a discharge duct, for connecting the discharge portion and the upper cabinet, are formed on a fitting surface between the upper cabinet and the lower cabinet, so that the air sucked from the upper cabinet turns back into the upper cabinet, after cooling down the display devices and the optical parts, which are provided in the periphery thereof.

FIGS. 6(A) and 6(B) are partial cross-section views of a frame portion of an upper portion, within the general display apparatus. As is shown in FIG. 6(A), a screen 24 is supported between a screen attachment metal portion 27, which is fixed onto a metal attachment portion 25c of a frame 25 by a screw 26, and a projection portion 25b, which is provided on the frame 25.

An abutting portion 29 of the screen 24 upon the frame 25 is in contact with over a whole area thereof, as is shown in FIG. 6(A), from a viewpoint of designing, however in actual, due to accuracy of forming of parts and/or curve or warp of the frame 25, etc., a gap 29a is resulted, partially, as is shown in FIG. 6(B). And, a contacting portion 30 between the frame 25 and an upper back cover 28 is also in contact with over a whole area thereof, as is shown in FIG. 6(A), from a viewpoint of designing, however in actual, due to accuracy of forming of parts and/or curve or warp of the frame 25 and the upper back cover 28, etc., a gap 30a is resulted, partially, as is shown in FIG. 6(B). Accordingly, due to the gaps 29a and 30a, an outside of the display apparatus is in the condition communicating with a space within the upper cabinet, i.e., not building up a completely closed space.

In particular, since pressure within a discharge duct provided in downstream of the fan comes to be high, comparing to that around it, and an air leaks from the gaps, such as, a connecting portion of the discharge duct, etc., therefore, an amount or volume of the air turning back to the upper cabinet comes to be small comparing to the volume of air, which is sucked from the upper cabinet. Accordingly, with the negative pressure brought about within the upper cabinet, an air including dusts of an outside enters into, from the gaps 29a and 30a, and therefore there is a problem, the dusts are included into the air for cooling down the display devices and the optical parts in the periphery thereof.

Thus, with the display apparatus of the conventional art, there are possibilities of bringing about deterioration of performances due to adhesion of the dusts onto the display devices and the optical parts in the periphery thereof, lowering of the cooling efficiency due to adhesion of the dusts onto the fan, etc., and also of shortening the lifetime of the display devices and the optical parts in the periphery thereof.

An object, according to the present invention, is to provide a technology being suitable for increasing the cooling efficiency of the optical unit, thereby achieving a long lifetime thereof.

For dissolving such the problem as was mentioned above, according to the present invention, within a display apparatus for cooling down an optic unit within a lower cabinet, by circulating an air within an upper cabinet, an opening is formed in the upper cabinet, and a filter is provided on this opening.

BRIEF DESCRIPTION OF THE DRAWINGS

Those and other objects, features and advantages of the present invention will become more readily apparent from the following detailed description when taken in conjunction with the accompanying drawings wherein.

DETAILED DESCRIPTION OF PREFERRED EMBODIMENTS

Hereinafter, embodiments according to the present invention will be fully explained by referring to the attached drawings.

Figure 1:
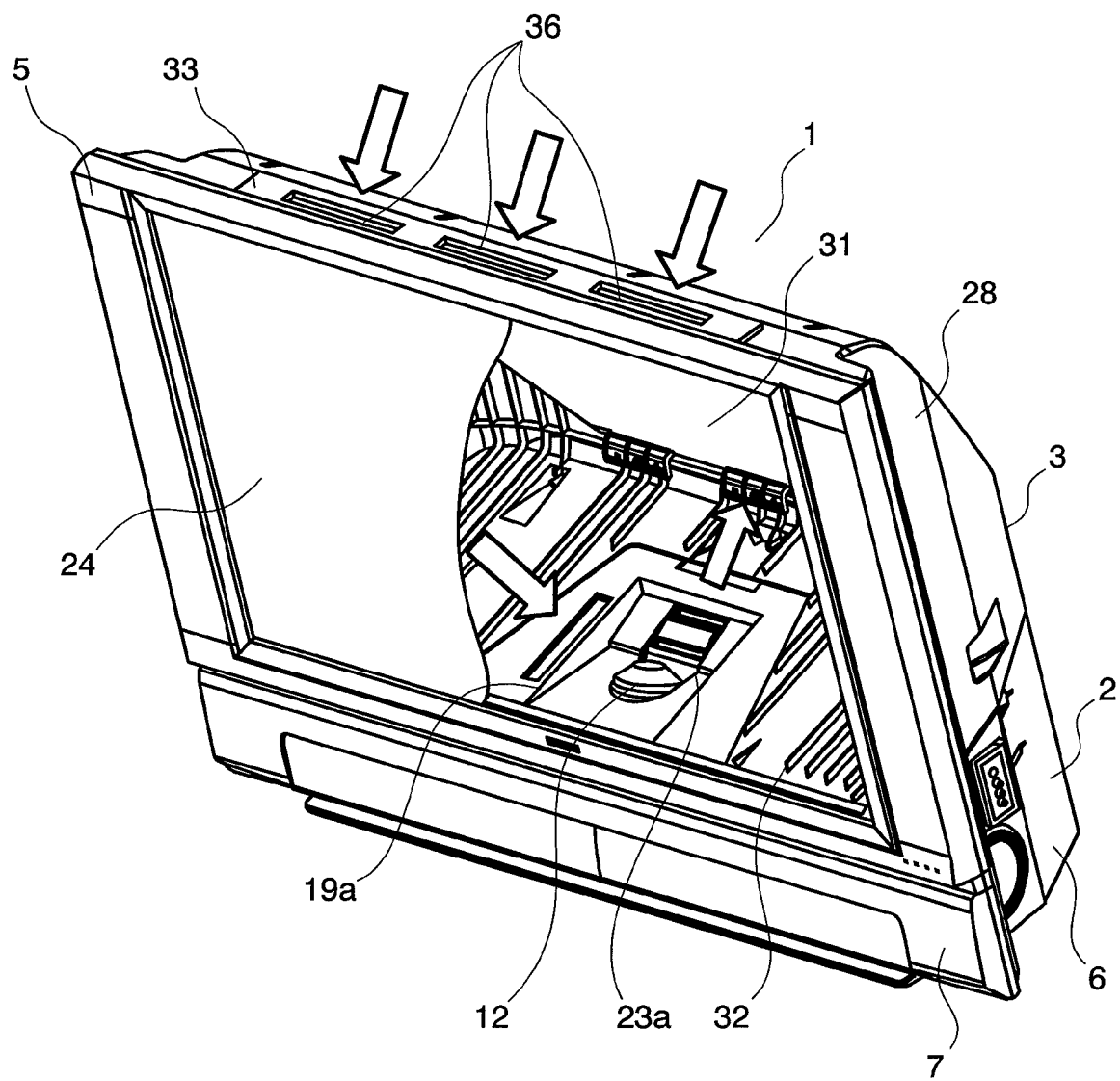
FIG. 1 is a perspective view for showing the structures of a display apparatus, according to an embodiment of the present invention.
Figure 2:
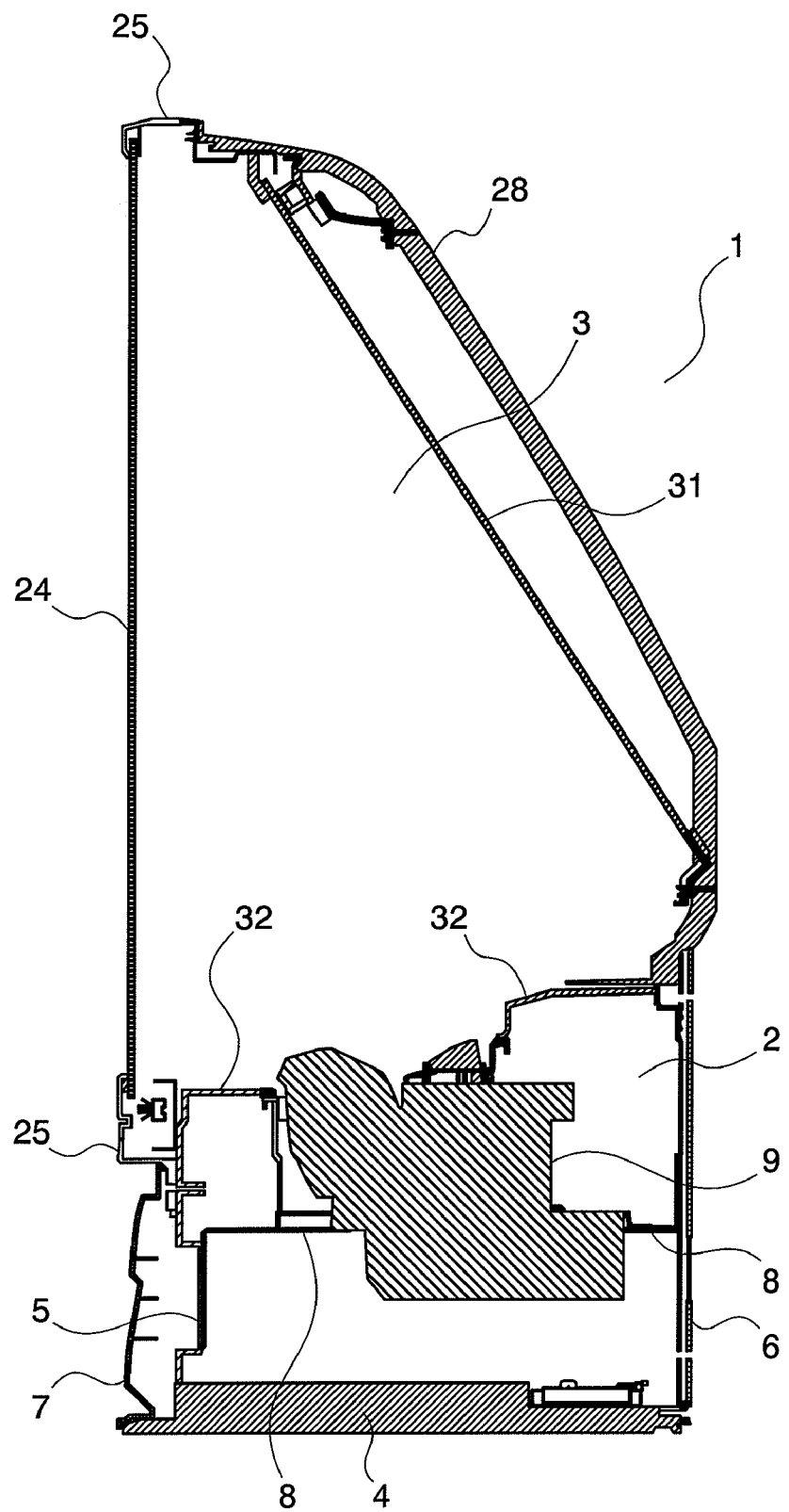
FIG. 2 is a cross-section view of the display apparatus, according to the present embodiment.

FIG. 1 shows an example of the structures of a display apparatus, according to the present embodiment. As is shown in FIG. 1, the display apparatus 1 comprises a lower cabinet 2 and a upper cabinet 3. FIG. 2 shows the cross-section of the display apparatus 1, in the vertical direction. As is shown in FIG. 2, the lower cabinet 2 is constructed with a bottom cabinet 4, a lower cabinet front wall 5, which is provided at a front end of the bottom cabinet 4, and a lower back cover 6, which is provided at a rear end of the bottom cabinet 4.

Also, on the lower cabinet 2 is mounted a front panel 7, so that it covers the lower cabinet front wall 5. Onto the lower cabinet front wall 5 and the lower back cover 6 is attached an optic unit 9 through a fixing member 8.

Figure 3:
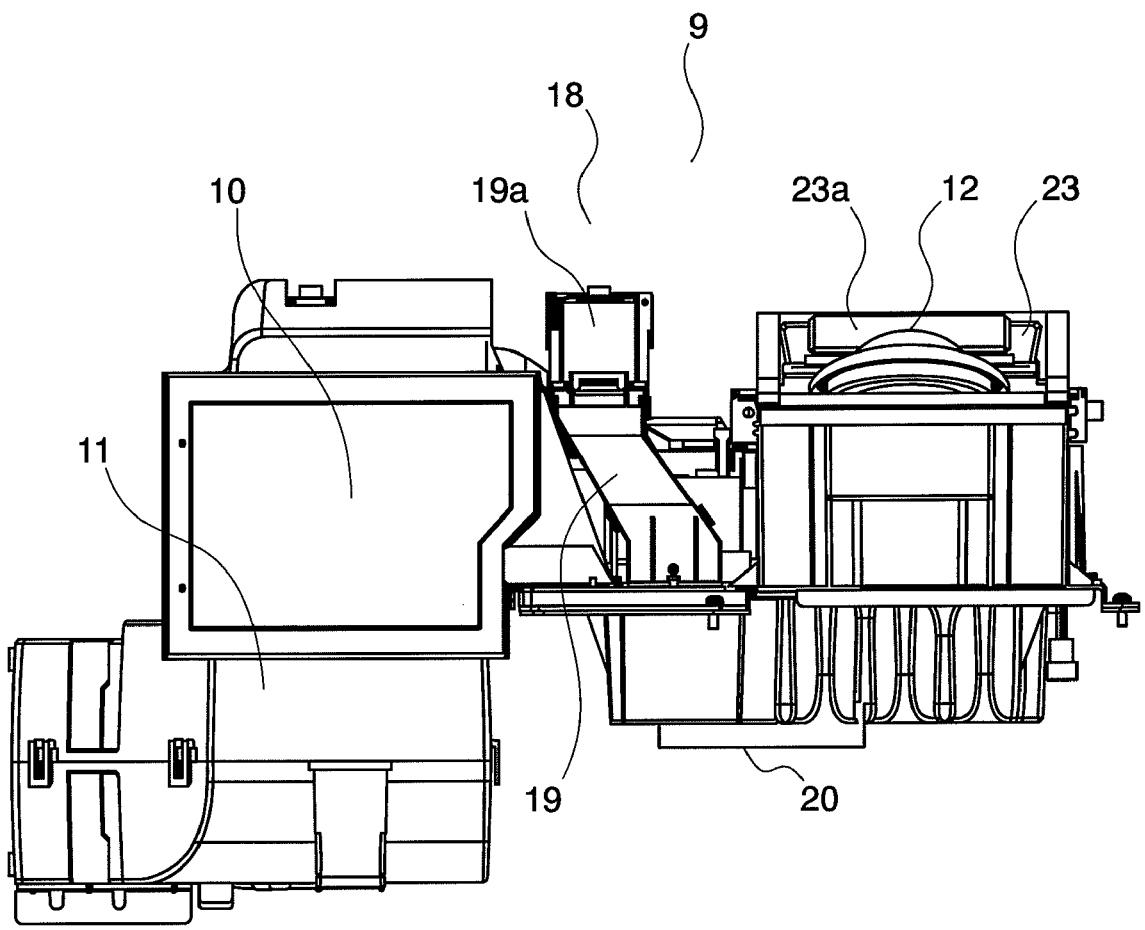
FIG. 3 is an upper view for showing a display device portion of an optical unit within the display apparatus, according to the present embodiment.
Figure 4:
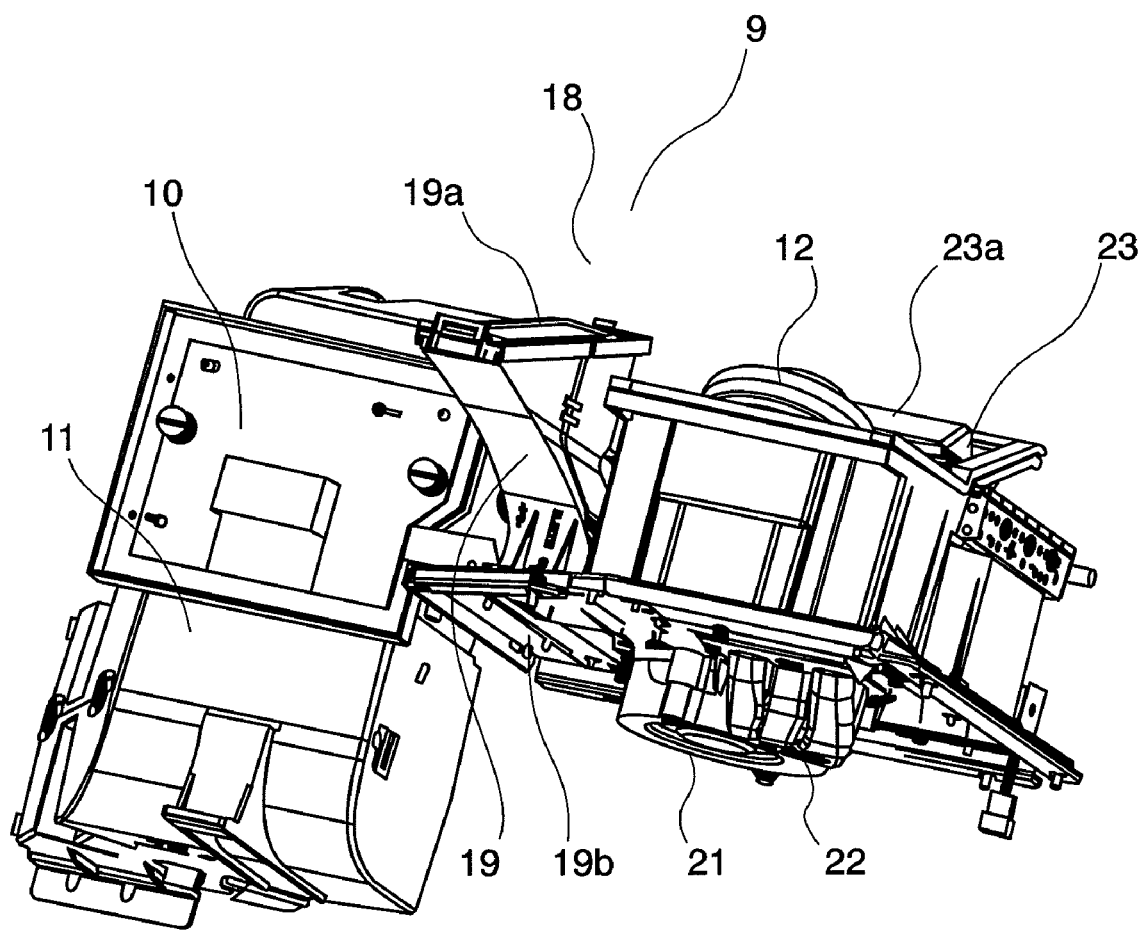
FIG. 4 is a side view for showing the optical unit within the display apparatus, according to the present embodiment.

As is shown in FIGS. 3 and 4, the optic unit 9 comprises a lamp receiving case 10 for receiving therein a lamp, as being a light source, but not shown in the figure, a discharging duct 11 for discharging an air after cooling down the lamp, which is received within the lamp receiving case 10, a projection lens 12 exposing to the upper cabinet 3 for projecting an image or picture, and a display device portion 13.

Figure 5:
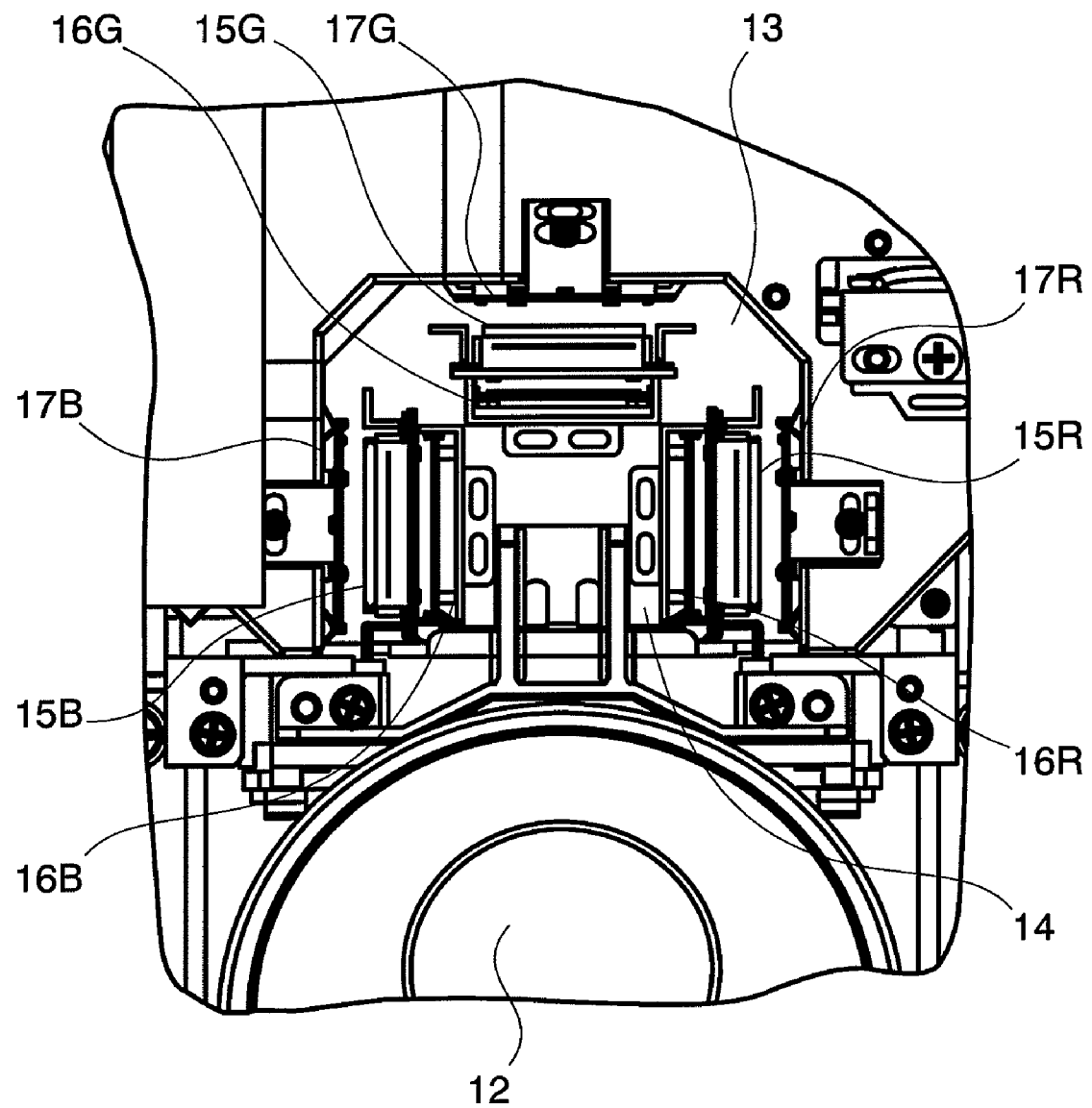
FIG. 5 is a perspective view for showing the condition of the optical unit within the display apparatus, according to the present embodiment, in particular, when removing a suction air duct cover thereof.

As is shown in FIG. 5, with the display device portion 13 is provided a synthesizing prism 14, and in the periphery of that synthesizing prism 14 are disposed display devices 15R, 15G and 15B, corresponding to three (3) colors of red (R), green (G) and blue (B). Between the synthesizing prism 14 and the respective display devices, there are disposed polarizing plates 16R, 16G and 16B, corresponding to each of the display devices. Also, further on surfaces of the display devices 15R, 15G and 15B, opposite to the surfaces facing to the polarizing plates 16R, 16G and 16B, there are disposed other polarizing plates 17R, 17G and 17B, corresponding to each of the display devices.

Also, with the display apparatus 1 according to the present embodiment, as is shown in FIGS. 3 and 4, there is provided a cooling unit 18 for cooling down the optic unit 9. The cooling unit 18 comprises a suction duct 19, a suction duct cover 20, a fan 21 connected to the suction duct cover 20, a blast duct 22, and a discharge duct 23 for discharging the air, which is fed from the blast duct 22 into the display device portion 13, into the upper cabinet 3.

The suction duct 19 comprises a suction opening 19a, which is opened into the upper cabinet 3, and a suction duct outlet 19b for discharging the air sucked from the suction opening 19a. The suction duct cover 20 is connected with the suction duct outlet 19b, so as to send the air within the suction duct 19 towards the fan 21.

The fan 21 is connected with the suction duct cover 20 and the blast duct 22. When driving the fan 21, suction of the air is made from the suction opening 19a of the suction duct 19, and the air sucked is supplied into the blast duct 22 by means of the fan 21. The blast duct 22 is so structured that it sends the air blown by the fan 21 into the display device portion 13.

The display device portion 13 builds up a blast passage for blowing the air blown from the blast duct 22 into the discharge duct 23, and the air blown from the blast duct 22 are guided by the display devices 15R, 15G and 15B and the polarizing plates 16R, 16G and 16B, and 17R, 17G and 17B, etc., into the direction of the discharge duct 23. The discharge duct 23 discharges the air guided by the display devices 15R, 15G and so on, from a discharge opening 23a into the upper cabinet 3.

On the discharge duct 23 is provided or formed the discharge opening 23a opening into the upper cabinet 3. The air guided by the display devices 15R, 15G, etc., after cooling down the optical parts within the optic unit 9, is discharged from the discharge opening 23a into a space defined within the upper cabinet 3.

Figure 6A:
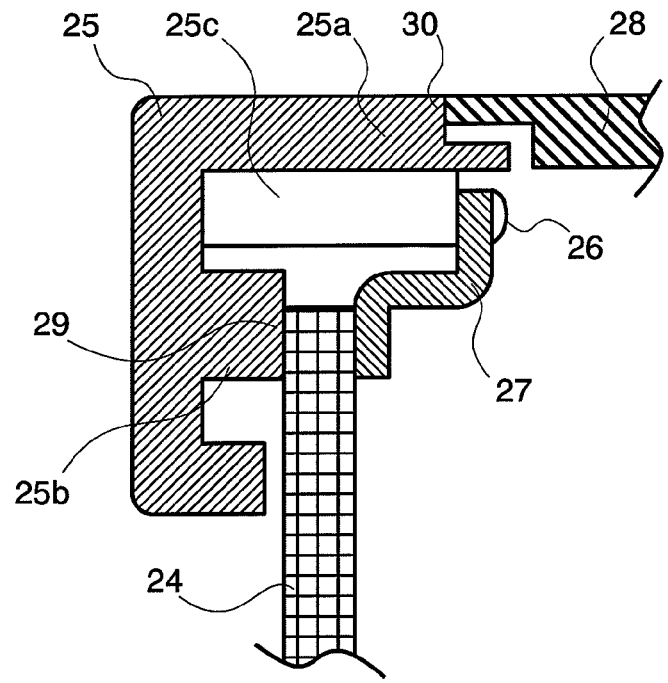
FIGS. 6(A) and 6(B) are partial cross-section views for showing the conditions of attaching a screen on a frame of the display device, according to the present embodiment.

As is shown in FIGS. 1 and 2, the upper cabinet 3 comprises a screen 24, a frame 25 and a upper back cover 28. Also, as is shown in FIG. 6(A), in the vicinity of a sidewall 25a inside the frame 25 is provided a projection portion 25b, which projects into an inside direction of the display apparatus 1. Between the sidewall 25a and the projection portion 25b is provided a metal attachment portion 25c.

Figure 6B:
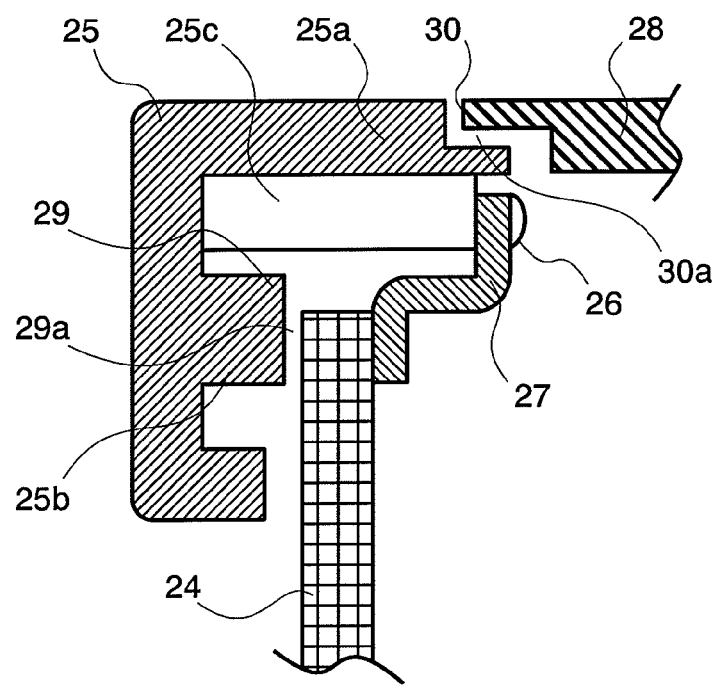

The screen is held between a screen attachment metal portion 27, which is screwed by a screw 26 onto the metal attachment portion 25c, and the projection portion 25b, at an end portion thereof, thereby being fixed onto the frame 25. Also, as is shown in FIG. 6(A), to an end portion of the sidewall 25a of the frame is connected an end portion of the upper back cover 28. On the other hand, as is shown in FIG. 6(B), at the connecting portion between the screen 24 and the frame 25, there is produced a gap 29a, partially. Also, at the connection portion between the frame 25 and the upper back cover 28, there is also produced a gap 30a, and through those gaps 29a and 30a, the space defined within the apparatus 1 is communicated with the space defined in the outside thereof. Also, on a surface of the upper back cover 28 is attached a mirror 31, within the inside of the display apparatus 1.

As is shown in FIGS. 1 and 2, between the lower cabinet 2 and the upper cabinet 3 is attached a partition panel 32, and by this portion panel 32 are defined independent spaces, each being independent inside of the lower cabinet 2 or the upper cabinet 3, respectively.

On an upper surface of the upper back cover 28 is formed an air inlet opening 28a for letting an air to flow from the outside of the apparatus 1 into the inside thereof. On the air inlet opening 28a is attached a filter unit 33, in a manner of covering it.

Figure 7:
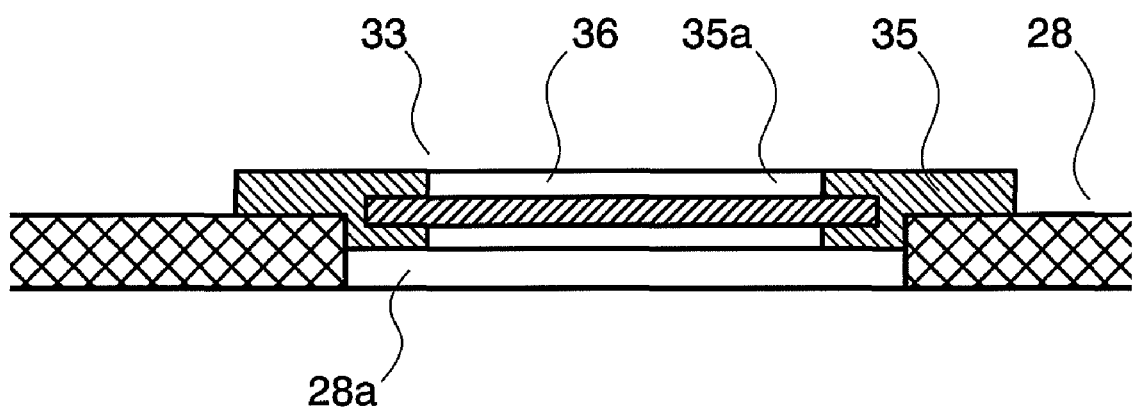
FIG. 7 is a view for showing the condition of mounting a filter unit at an air inlet of an upper cabinet.

The filter unit 33 is constructed, for example, as is shown in FIG. 7, by forming an opening 35 on a long plate-like fixing member 34, and inserting a filter 36 into the opening(s) 35. There is no limitation in the number of openings 35 to be formed on the fixing member 34, and it may be only one (1) or a plural number. Also, according to the present embodiment, by taking the suction/discharge air (i.e., convection of air) into/from the upper cabinet 3 into the consideration thereof, the air inlet opening 28a is provided on an upper portion of the upper cabinet 3. However, the air inlet opening 28a may be provided on a side surface of the upper cabinet 3.

The filter unit 33 is made detachable onto the upper back cover 28. There is no limitation; in particular, with a method of attaching the filter unit 33 onto the upper back cover 28, however for example, it is fixed by screwing the fixing member 34 onto the upper back cover 28 by a screw not shown in the figure.

As the filter 36 is used such a filter that a suction load generated at the gaps 29a and 30a comes to be smaller than that generated at the air inlet opening 28a, when driving the cooling unit 18. A filter to be used as the filter 36 is that for removing the dusts, being equal or larger than a predetermined size when it passes the air therethrough. As the filter to be used herein, the followings can be listed up: for example, a filter having physically fine meshes, an electro-statistic collection type filter, being rough in the physical meshes, but enabling electro-statistic collection, or a type of filter having fluid channels being tangled in complex, for passing the air therethrough. With using those filters, it is possible to make the size of dusts small, which can flows into the inside of the display apparatus 1.

Figure 8:
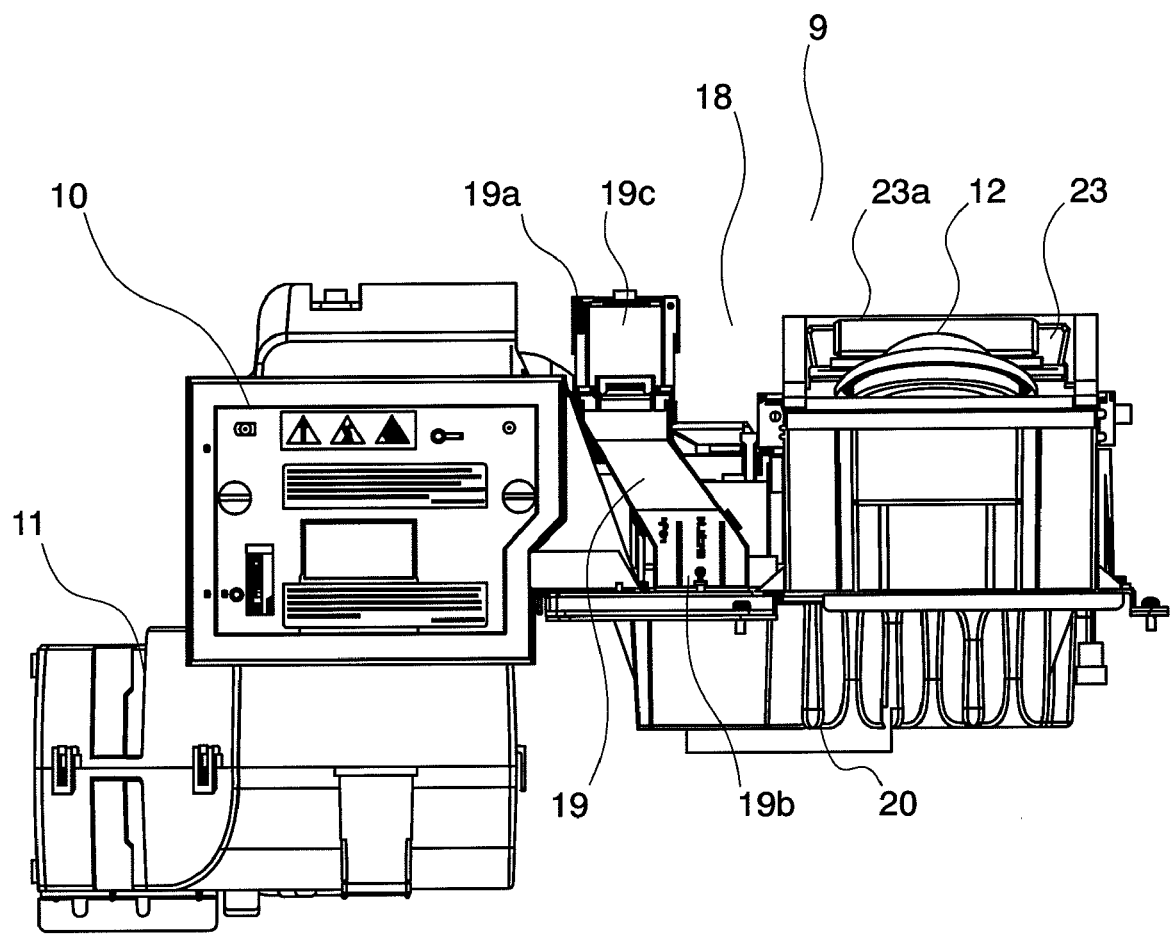
FIG. 8 is a view for showing the condition of mounting a filter at a suction opening of a suction duct of a cooling unit within the display apparatus, according to the present embodiment.

However, as shown in FIG. 8, it is also possible to provide a filter 19c at the suction opening 19a of the suction duct 19. A user carries out exchange of the filter unit 33 or cleaning of the filter 36, when the filter 36 causes clogging therein. Where the user continues the use thereof, but without exchange of the filter unit 33 or cleaning of the filter 36, there may be a case when the suction load of the filter 36 comes to be larger than that from the gaps 29a and 30a. In this case, the air including the dusts therein enters into the upper cabinet 3 from the gaps 29a and 30a. Even in such case, because of provision of the suction air filter 19c at the suction opening 19a of the suction duct 19, then the dust entering from the gaps 29a and 30a are prevented or suppressed from entering into the display device portion 13

Therefore, since enabling to prevent the dusts from adhering onto the fan 21, and also to cool down the optic unit 9 with high efficiency; therefore, it is possible to obtain a long lifetime of the optic unit 9 of the display panel and in the periphery thereof. Also, since there is no chance for the optic unit 9 to be blasted with the air including the dusts therein, therefore it is possible to prevent the dusts from entering into the display device portion 13, and also to reduce the dusts adhering onto the optic unit 9, thereby enabling protection from deterioration of the picture quality.

When driving the display apparatus 1, lights are emitted from a lamp (not shown in the figure), which is received within the lamp receiving case 10 of the optic unit 9, and an image or picture is emitted from the projection lens 12 towards the mirror 31 depending on the light emitted. The image or picture emitted towards the mirror 31 is reflected upon the surface of the mirror 31, and the reflected image is projected onto the screen 24. And, when driving the display apparatus 1, the cooling unit 18 is also driven.

Figure 9:
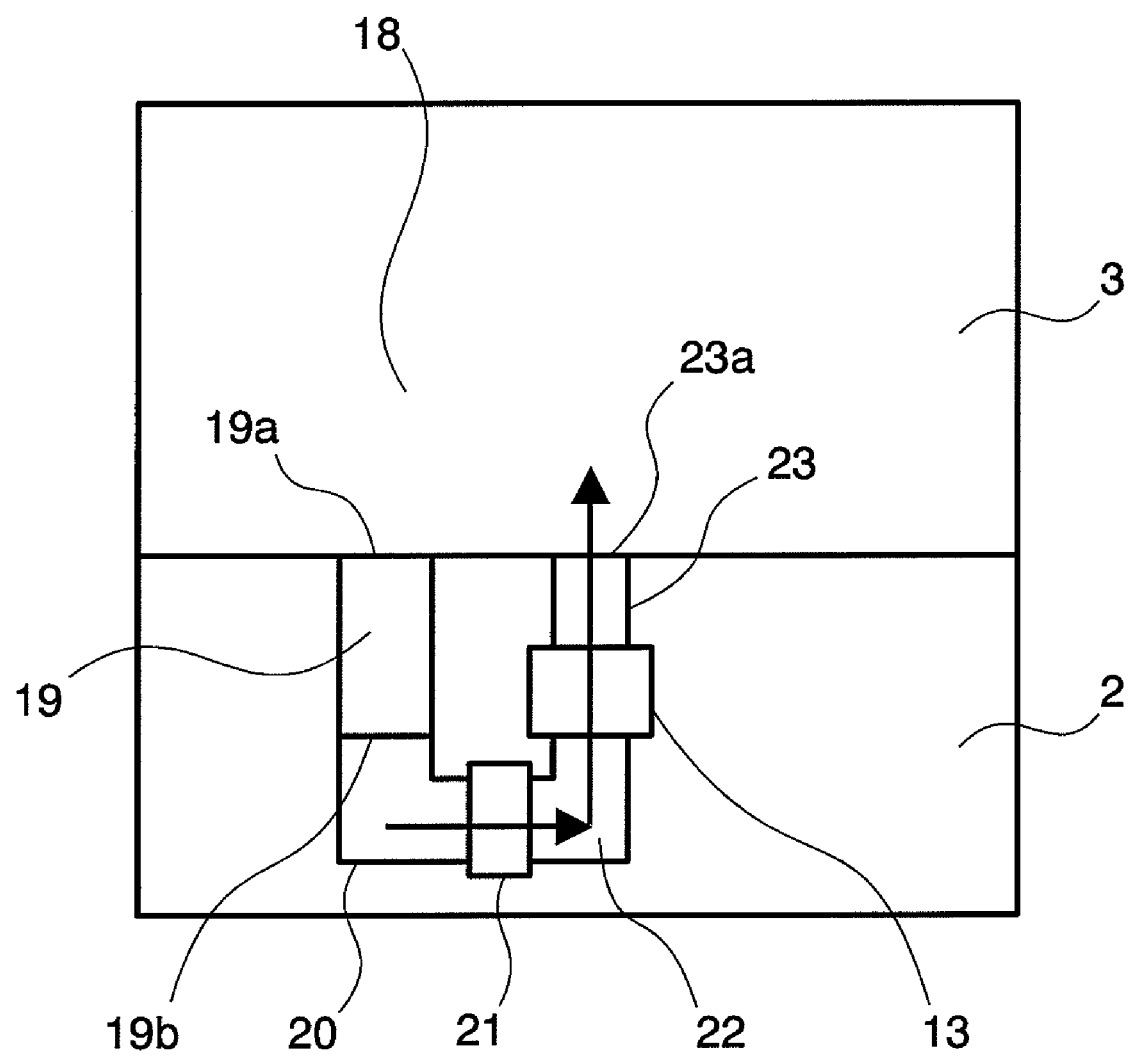
FIG. 9 is a view for diagramming a flow of cooling air with the display apparatus, according to the present embodiment.

When the fan 21 of the cooling unit 18 is operated, it sucks the air within the upper cabinet 3 from the suction opening 19a, as is shown in FIG. 9. The air sucked from the suction opening 19a passes through the suction duct 19, and it goes out from the suction duct outlet 19b. And, passing through within the suction duct cover 20, it is sent to the fan 21. The air discharged from the fan 21 passes through the blast duct 22, and is blasted on the display device portion 13. The air blasted upon the display device portion 13 cools down the display devices 15R, etc., building up the display device portion 13, and the optic unit 9 comprising the polarizing plates 16R, etc., and also the synthesizing prism 14. The air after cooling down the optic unit 9 is sent to the discharge duct 23, to be discharged from the discharge opening 23a of the discharge duct 23.

When driving the cooling unit 18, because of generation of the air leakage, an amount or volume of the air turning back to the upper cabinet 3 comes to be small, comparing to that of the air sucked from the upper cabinet 3, in particular, at portions combining the parts on the discharge side of the fan 21 where pressure goes up high comparing to the periphery, such as, a portion combining the fan 21 and the blast duct 22, and a portion combining the blast duct 22 and the display device portion 13, for example, and therefore, the upper cabinet 3 has tendency of becoming negative in pressure.

And, when the pressure within the upper cabinet 3 becomes negative, because the filter 36 is provided at the air inlet opening 28a, the suction load generating at the air inlet opening 28a is small, comparing to the suction load generating at the gaps 29a and 30a, and therefore, the air after removed from the dusts through the filter 36 of the filter unit 33 flows into an inside of the upper cabinet 3, i.e., not suck the air including the dusts from the gaps 29a and 30a. Accordingly, there is no change that dusts enter into the display apparatus 1.

Also, the filter 36 of the filter unit 33 becomes to be clogged due to adhesion of dusts removed therewith, accompanying with the time-period of use thereof. In this instance, the filter unit 33 may be exchanged with a new one, or after cleaning the filter 36 to remove the dusts adhering thereon, and then the filter after cleaning may be attached to the filter unit 33, again.

As was mentioned in the above, the air including the dusts therein is prevented from entering into the upper cabinet 3 of the display apparatus by means of the filter 36. For that reason, no dust adheres on the projection lens 12, the display devices 15R, etc., and the polarizing plates 16R, etc., building up the optic unit 9, and therefore it is possible to cool down the optic unit 9 with protecting it from deterioration of the picture quality. And, since it is also possible to prevent the dusts from adhering onto the fan 21, the optic unit 9 can be cooled down, effectively. For that reason, it is possible to obtain a long lifetime of the display devices 15R, etc., and also the optical parts in the periphery thereof.

With such structures as was mentioned above, it is possible to increase the efficiency of cooling the optic unit, and thereby obtaining a long lifetime thereof.

While we have shown and described several embodiments in accordance with our invention, it should be understood that disclosed embodiments are susceptible of changes and modifications without departing from the scope of the invention. Therefore, we don not intend to be bound by the details shown and described herein but intend to cover all such changes and modifications that fall within the ambit of the appended claims.

What is claimed is:

1. A display apparatus, comprising:
   an upper cabinet, to which a screen is attached;
   an optic unit having optical parts for forming an image to be projected onto said screen; and
   a lower cabinet including a cooling unit for circulating an air within said upper cabinet through said optical parts, wherein
   a suction portion, which is configured to suck an air within said upper cabinet into said lower cabinet
   a discharge portion, which is configured to discharge the air flowing from said suction portion into an inside of said upper cabinet, wherein
   said cooling unit sucks the air within said upper cabinet through said suction portion, thereby cooling said optic unit, and discharges the air within said upper cabinet through said discharge portion, thereby circulating a cooling air, and
   an opening is formed in said upper cabinet, and a first filter is provided at said opening.

2. The display apparatus, as described in the claim 1, wherein said opening is provided in an upper portion of said upper cabinet.

3. The display apparatus, as described in the claim 1, wherein said first filter is detachable.

4. The display apparatus, as described in the claim 1, wherein said cooling unit comprises a suction duct and a fan, and also a suction opening of said suction duct is located at a position within said upper cabinet, and it is attached with a second filter.

5. The display apparatus, as described in the claim 1, wherein a gap is generated in said upper cabinet, and further said first filter generates suction negative pressure at said opening, being smaller than suction negative pressure, which is generated at said gap when said cooling unit sucks the air.

6. The display apparatus, as described in the claim 1, wherein said optic unit includes a display device and a polarizing plate, which is disposed on a display surface of said display device.

7. A display apparatus, comprising:
   an upper cabinet, to which a screen is attached;

an optic unit having optical parts for forming an image to be projected onto said screen; and a suction portion, which is configured to suck an air within said upper cabinet; and a discharge portion, which is configured to discharge the air within said upper cabinet, a lower cabinet including a cooling unit for cooling down said optic unit by sucking and blowing an air from an inside of said upper cabinet through said suction portion, and for discharging the air after cooling into the inside of said upper cabinet through said discharge portion, wherein an opening is formed in said upper cabinet, and a first filter is provided at said opening.

8. The display apparatus, as described in the claim 7, wherein a gap is generated in said upper cabinet, and further said first filter generates suction negative pressure at said opening, being smaller than suction negative pressure, which is generated at said gap when said cooling unit sucks the air.

9. The display apparatus, as described in the claim 7, wherein said optic unit includes a display device and a polarizing plate, which is disposed on a display surface of said display device.

* * * * *